US008610876B2

(12) United States Patent
Mann

(10) Patent No.: US 8,610,876 B2
(45) Date of Patent: Dec. 17, 2013

(54) REFLECTIVE OPTICAL ELEMENT, PROJECTION SYSTEM, AND PROJECTION EXPOSURE APPARATUS

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 335 days.

(21) Appl. No.: 13/046,137

(22) Filed: Mar. 11, 2011

(65) Prior Publication Data

US 2011/0228245 A1 Sep. 22, 2011

Related U.S. Application Data

(60) Provisional application No. 61/332,288, filed on May 7, 2010.

(30) Foreign Application Priority Data

Mar. 17, 2010 (DE) .......................... 10 2010 002 986

(51) Int. Cl.
G03B 27/70 (2006.01)
G03B 27/68 (2006.01)
G03B 27/52 (2006.01)
G03B 27/42 (2006.01)
G03B 27/54 (2006.01)

(52) U.S. Cl.
USPC .................. 355/66; 355/52; 355/53; 355/55; 355/60; 355/67

(58) Field of Classification Search
USPC .............. 355/52, 53, 55, 60, 66–71; 359/359, 359/584, 586; 250/492.1, 492.2, 492.22, 250/493.1, 548; 430/5, 8, 22, 30, 311, 312, 430/321
See application file for complete search history.

(56) References Cited

U.S. PATENT DOCUMENTS 5,360,659 A * 11/1994 Arends et al. ................. 428/216
6,861,273 B2 * 3/2005 Anderson et al. ............... 438/30
(Continued)

FOREIGN PATENT DOCUMENTS

EP       1 930 771 A       6/2008
WO    WO 2008/133254    11/2005

OTHER PUBLICATIONS

English translation of German Office Action for corresponding DE Appl No. 10 2010 002 986.6-51, dated Aug. 12, 2010.

*Primary Examiner* — Toan Ton
*Assistant Examiner* — Christina Riddle
(74) *Attorney, Agent, or Firm* — Fish & Richardson P.C.

(57) ABSTRACT

For the use in illumination systems and projection exposure apparatuses for UV or EUV lithography, a reflective optical element is provided for a operating wavelength in the ultraviolet to extreme ultraviolet wavelength ranges. The reflective optical element includes a substrate and a reflective surface on the substrate. The multilayer system has layers of at least two alternating materials having different real parts of the refractive index at the operating wavelength. Radiation in the operating wavelength of a certain incident angle bandwidth distribution can impinge on the reflective optical element. The reflective surface includes one or more first portions, in which the layers have alternating materials of a first period thickness. The reflective surface includes one or more additional portions, in which the layers of alternating materials have a first period thickness and at least one additional period thickness. The arrangement of the first and additional portions across the reflective surface is adapted to the incident angle bandwidth distribution. Furthermore, a projection system and a projection exposure apparatus including such a reflective optical element are suggested.

23 Claims, 12 Drawing Sheets

(56) References Cited

U.S. PATENT DOCUMENTS

| | | |
|---|---|---|
| 7,450,301 B2 * | 11/2008 | Mann et al. .................... 359/366 |
| 7,573,562 B2 * | 8/2009 | Kuwabara ....................... 355/67 |
| 2001/0033421 A1 * | 10/2001 | Murakami et al. ............ 359/584 |
| 2002/0171922 A1 * | 11/2002 | Shiraishi et al. .............. 359/359 |
| 2003/0081722 A1 * | 5/2003 | Kandaka et al. ................ 378/70 |
| 2004/0263820 A1 | 12/2004 | Singh et al. |
| 2005/0157384 A1 * | 7/2005 | Shiraishi et al. .............. 359/359 |
| 2006/0062348 A1 * | 3/2006 | Shiraishi ......................... 378/34 |
| 2006/0152701 A1 * | 7/2006 | Totzeck et al. .................. 355/71 |
| 2008/0165415 A1 | 7/2008 | Chan et al. |
| 2008/0316451 A1 * | 12/2008 | Mann et al. ...................... 355/53 |
| 2009/0147364 A1 * | 6/2009 | Kotoku et al. ................. 359/584 |
| 2010/0195075 A1 * | 8/2010 | Chan et al. ....................... 355/67 |
| 2011/0122384 A1 | 5/2011 | Mann |

* cited by examiner

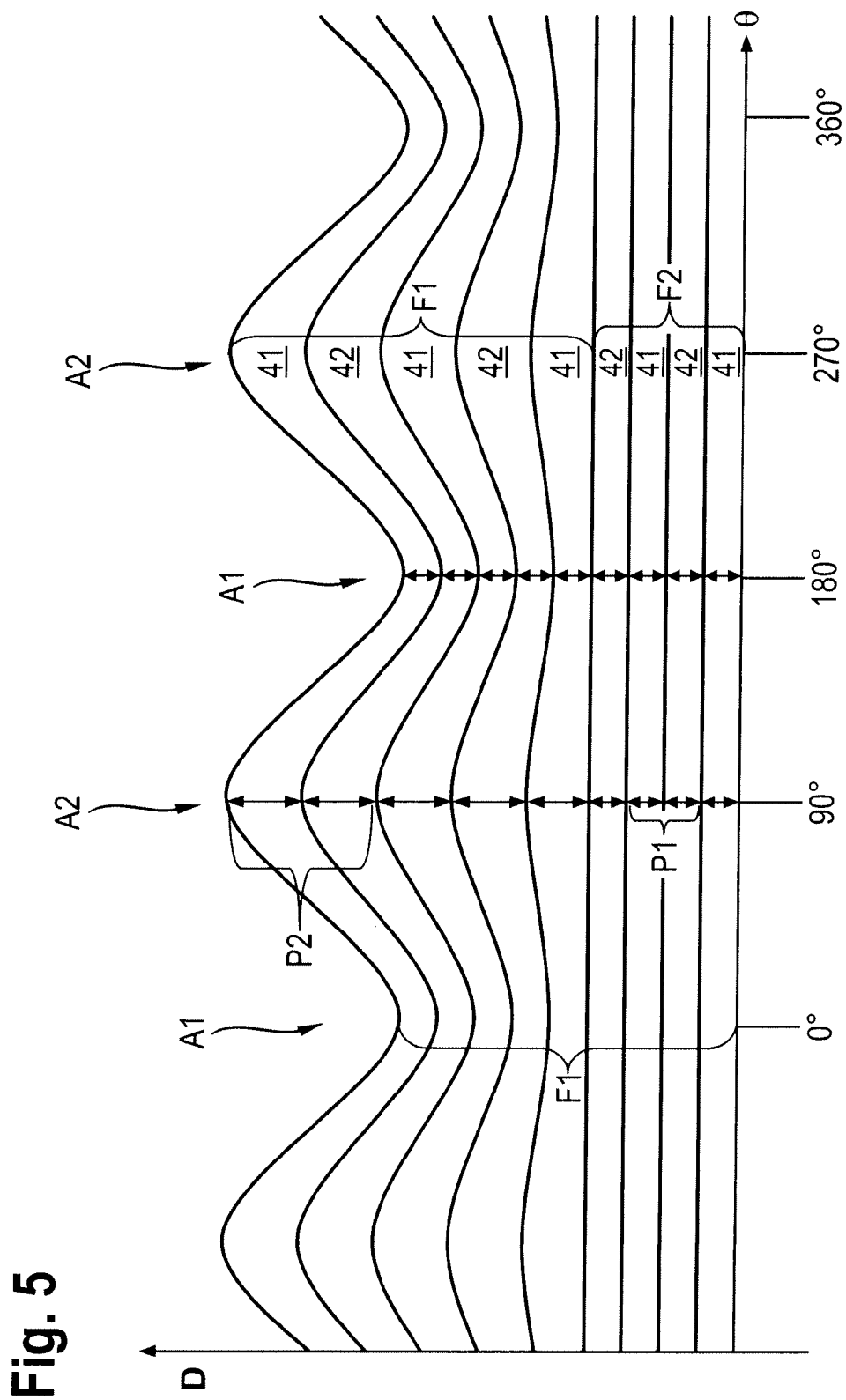

REFLECTIVE OPTICAL ELEMENT, PROJECTION SYSTEM, AND PROJECTION EXPOSURE APPARATUS

CROSS-REFERENCE TO RELATED APPLICATIONS

This application claims priority under 35 U.S.C. §119(e)(1) to U.S. Provisional Application No. 61/332,288 filed May 7, 2010. This application also benefit under 35 U.S.C. §119 to German Application No. 10 2010 002 986.6-51, filed Mar. 17, 2010. The contents of both of these applications are hereby incorporated by reference in its entirety.

FIELD

The present disclosure relates to a reflective optical element for a operating wavelength in the ultraviolet to extreme ultraviolet wavelength ranges. The reflective optical element includes a substrate and a reflective surface on the substrate. The reflective surface includes a multilayer system having layers of at least two alternating materials having different real parts of the refractive index at the operating wavelength. Radiation in the operating wavelength of a certain incident angle bandwidth distribution can impinge on the reflective optical element. The reflective surface has first portions, in which the layers of alternating materials have a first period thickness. The reflective surface also has additional portions, in which the layers of alternating materials have a first period thickness and an additional period thickness. Furthermore, the disclosure relates to projection systems and projection exposure apparatuses, which include such reflective optical elements.

BACKGROUND

To be able to produce ever finer structures in the production of semiconductor components with lithographic methods, light of an increasingly shorter wavelength is used. When working in the extreme ultraviolet (EUV) wavelength range, at a wavelength, in particular, between about 5 nm and 20 nm, it is generally no longer possible to work with lens-like elements in the transmission mode. Rather, illumination and projection objectives, or masks, of reflective optical elements are constructed, having reflective coatings adapted to each operating wavelength, on the basis of multilayer systems. Reflective optical elements on the basis of multilayer systems can also be used for the ultraviolet wavelength range.

Multilayer systems are alternately applied layers of a material having a higher real part of the refractive index at the operating wavelength (also referred to as a spacer) and a material having a lower real part of the refractive index at the operating wavelength (also referred to as an absorber). An absorber-spacer pair forms a stack of a certain period thickness. The period thickness is equal to the sum of the individual layers forming a stack. Alternately arranging stacks with an absorber-spacer pair essentially simulates a crystal. Its lattice planes correspond to the absorber layers, on which Bragg reflection occurs. In more complex multilayer systems, a stack may include one or more additional layers besides the absorber layer and the spacer layer. These additional layers may have the function of e.g. avoiding chemical mixing of the spacer material and the absorber material or of enhancing thermal stability of the stacks e.g. in case of heating of the reflective optical element due to infrared radiation.

To be able to image ever finer structures on objects to be exposed, the optical systems of the projection exposure apparatuses desirably ensure the highest possible resolution. This is achieved not only by the use of the smallest possible wavelengths as an operating wavelength, but also by designing optical systems with the largest possible aperture. This has a drawback, however, that both the mean incident angle and the bandwidth of the incident angles can vary widely on individual mirrors as well as from one mirror to another of the optical systems. This can lead to a lower transmission of useful radiation and to imaging defects, leading to a reduced throughput of the projection exposure apparatus, or to an extremely inhomogeneous pupil illumination, so that the imaging quality deteriorates substantially.

SUMMARY

The present disclosure provides reflective optical elements, in particular for the use in high-resolution UV, or EUV lithography.

According to a first aspect, the disclosure provides a reflective optical element for a operating wavelength in the ultraviolet to extreme ultraviolet wavelength ranges, including, on a substrate, a reflective surface with a multilayer system having layers of at least two alternating materials with different real parts of the refractive index at the operating wavelength. Radiation in the operating wavelength of a certain incident angle bandwidth distribution can impinge on the reflective optical element. The reflective surface includes one or more first portions, in which the layers of alternating materials have a first period thickness. The reflective surface also includes one or more further portions, in which the layers of alternating materials have a first period thickness and at least one additional period thickness. The arrangement of the first and further portions across the reflective surface is adapted to the incident angle bandwidth distribution.

It has been found that portions where the layers of alternating materials have more than one period thickness across the depth of the multilayer system, in other words where the layer thicknesses of different stacks with absorber-spacer-pairs vary, allow significant reflectivity across a broader incident angle band, while the maximum reflectivity is reduced, in comparison to portions where the layers of alternating materials have essentially one period thickness across the depth of the multilayer system. By adapting the arrangement of one or more portions having layers of one period thickness, and further portions having layers of more than one period thickness, to the distribution of the incident angle bandwidth across the reflective surface of the reflective optical element, for example, by arranging portions having one period thickness at locations with a narrow incident angle bandwidth, and arranging portions having more than one period thickness at locations with a larger incident angle bandwidth, across the depth of the multilayer system, the overall reflectivity of the reflective optical element can be increased or imaging characteristics, such as the telecentricity or ellipticity, can be improved in comparison to a conventional reflective optical element, wherein the multilayer system forming the reflective surface has a period thickness distribution that is independent of the incident angle bandwidth distribution, such as a period thickness distribution that is constant across the reflective surface. Using the special design of the multilayer system of the reflective surface, the reflective optical element has improved reflectivity and is thus particularly suitable for use in UV, or EUV lithography using projection exposure apparatuses having a high numerical aperture, where the throughput is increased by using the reflective optical element. The reflective optical element can be, for example, a mirror of a projection exposure apparatus, in particular of a projection system of a projection exposure apparatus.

Optionally, the arrangement of the first and further portions across the reflective surface is adapted to the variation of the mean incident angle by making use of the fact that, at a certain wavelength, e.g. the operating wavelength, the maximum reflectivity can be shifted to slightly higher or lower incidence angles by specifically changing the period thickness.

It has to be noted that both the incident angle bandwidth distribution as well as the distribution of mean incidence angles can be precisely calculated when knowing the light source to be used and the optical elements arranged in front of the reflective optical element in question. This information can therefore be taken into account already when designing the structure of the multilayer system of the reflective optical element. In addition, surface defects that generated during the manufacturing of reflective optical elements and have been detected during quality controls and that could induce imaging errors, can be compensated for by e.g. subsequently adding additional layers such as explained in US2004/0263820 A1.

Optionally, the reflective surface has two or more first portions, wherein the first period thickness is the same in all first portions. Optionally, the reflective surface has two or more additional portions, wherein the at least one period thickness is the same in all additional portions. The provision of the smallest possible number of different period thicknesses in the multilayer system of the reflective surface simplifies the coating process when the multilayer system is applied to a substrate during the manufacture of the reflective optical element.

Advantageously, the at least one first portion includes a sequence of layers of alternating materials having precisely one period thickness, and the at least one further portion includes at least two sequences of layers of alternating materials, each having precisely one period thickness, wherein one of these sequences has the same period thickness as the sequence of the at least one first portion. The coating process may thus be subdivided into individual steps for each type of sequence, and thus simplified.

Optionally, in the at least one further portion, the sequence having the same period thickness as the sequence of the at least one first portion, is arranged between the substrate and the at least one further sequence. At the beginning of the coating process, a contiguous surface of layers of alternating materials having a continuous period thickness can be applied, which correspond to the respective sequences of the further portions having the first period thickness, or to the first layers of the sequence of the first portions. Differentiating the coating process according to different portions will then only be involved for the layers above. Existing coating processes thus only have to be minimally adapted to the multilayer systems suggested here.

In some embodiments, the arrangement of the first and further portions across the reflective surface is periodic in the azimuthal direction. An azimuthally periodic arrangement is particularly advantageous with polygonal object or image fields.

Symmetric polygonal object or image fields, have an azimuthally periodic distribution of the incident angle bandwidths on the imaging reflective optical elements across their surface, if these reflective optical elements are directly in, or at least near, a pupil plane. Object or image fields having the form of an equilateral triangle have, for example, an incident angle bandwidth distribution on a near-pupil reflective optical element that is azimuthally periodic with three periods, object or image fields having the form of a square have an incident angle bandwidth distribution on a near-pupil reflective optical element that is azimuthally periodic with four periods, and object or image fields having the form of a regular hexagon have an incident angle bandwidth distribution on a near-pupil reflective optical element that is azimuthally periodic with six periods.

Advantageously, the arrangement of the first and further portions across the reflective surface is periodic in the azimuthal direction with two periods. A reflective optical element having such an arrangement of the portions of the multilayer system of its reflective surface is particularly suitable for use in projection exposure apparatuses, where the structure of a mask, also referred to as a reticle, is illuminated in portions and images onto an object to be exposed. Often these portions have an essentially oblong rectangular shape, where one side length is substantially longer than the other side length. In variants, each imaged portion of the reticle structure is scanned, wherein the scan area is also often rectangular. These projection exposure apparatuses are mostly also designed for oblong rectangular object or image fields. Oblong rectangular object or image fields produce an incident angle distribution on a near-pupil reflective optical element, which is azimuthally periodic with two periods, to which the reflective optical element having an azimuthally periodic portion distribution with two periods is particularly well suited.

Optionally, the arrangement of the first and further portions across the reflective surface corresponds to a distribution that can be expressed as $$D(r, \vartheta) = \sum_{i=1}^{N} D_i(r)\Psi_i(2\vartheta),$$

wherein r is the distance of a point on the reflective surface from the origin of a coordinate system, θ corresponds to the azimuthal angle of the point on the reflective surface, N is the number of different sequences in a portion, $D_i(r)$ is a radially symmetric layer thickness profile and $\Psi_i(2\theta)$ is an azimuthally periodic function. Based on this distribution, conventional reflective optical elements having multilayer systems with a layer thickness profile $D_i(r)$ can be particularly easily modified to create the reflective optical systems described here, by multiplying and summing conventional layer thickness profiles $D_i(r)$, already optimized in view of various criteria, with the two-wave azimuthally periodic function $\Psi_i(2\theta)$ for all i from 1 to N. With this approach, the period thicknesses are changed within the individual sequences. Depending on each period thickness, the sequences have significant reflectivity for a narrower or larger incident angle bandwidth. The arrangement of the portions with one or more sequences, is adapted to the distribution of the incident angle bandwidth using the function $\Psi_i(2\theta)$.

Optionally, the two-wave azimuthally periodic function $\Psi_i(2\theta)$ is a step function or a sine or cosine function. Such multilayer systems can be manufactured particularly easily with the use of shutters during the coating process.

According to a further aspect, a projection system for a projection exposure apparatus is provided which operates at a wavelength in the ultraviolet or extreme ultraviolet wavelength ranges, and includes one or more such reflective optical elements. Such projection systems, when used in lithography, have the advantage of improved transmission of useful radiation and improved imaging characteristics.

In certain embodiments, the projection system is configured as a pupil-obscured system. For this purpose, the projection system includes a plurality of mirrors for imaging an object field in an object plane into an image field in an image plane, wherein at least one of the mirrors has an aperture for the passage of imaging light. In such projection systems, both mean incident angles and incident angle bandwidths can be reduced in comparison to projection systems without pupil obscuration at a comparable numerical aperture. It has the advantage that, with a reflective optical element used as a mirror in the projection system with pupil-obscuration, the mean incident angles are substantially smaller, and thus allows higher reflectivity, on principle, across a given incident angle bandwidth.

Optionally, the mirror with the largest incident angle bandwidth is provided as a reflective optical element as described above. With this approach, a particularly pronounced reflectivity improvement can be achieved in comparison to conventional mirrors and the throughput in a projection exposure apparatus with such a projection system can be notably increased.

Advantageously, the reflective optical element is arranged in a pupil plane of the projection system or in its vicinity, in particular if the arrangement of the first and further portions is periodical in the azimuthal direction across the reflective surface.

Furthermore, a projection exposure apparatus is provided, which is operated at a wavelength in the extreme ultraviolet wavelength range and has a reflective optical element as suggested.

The above and further features can be derived from the description and the drawings as well as from the claims, wherein the individual features can be implemented alone or in combination in the form of subcombinations in an embodiment of the disclosure and also in other fields, and can represent advantageous embodiments, and embodiments worthy of protection as such.

BRIEF DESCRIPTION OF THE DRAWINGS

The present disclosure will be explained in more detail with reference to an exemplary embodiment, wherein:

FIG. 5 schematically shows a second example of a distribution of different portions across the reflective surface of a reflective optical element;

DETAILED DESCRIPTION

Figure 1:
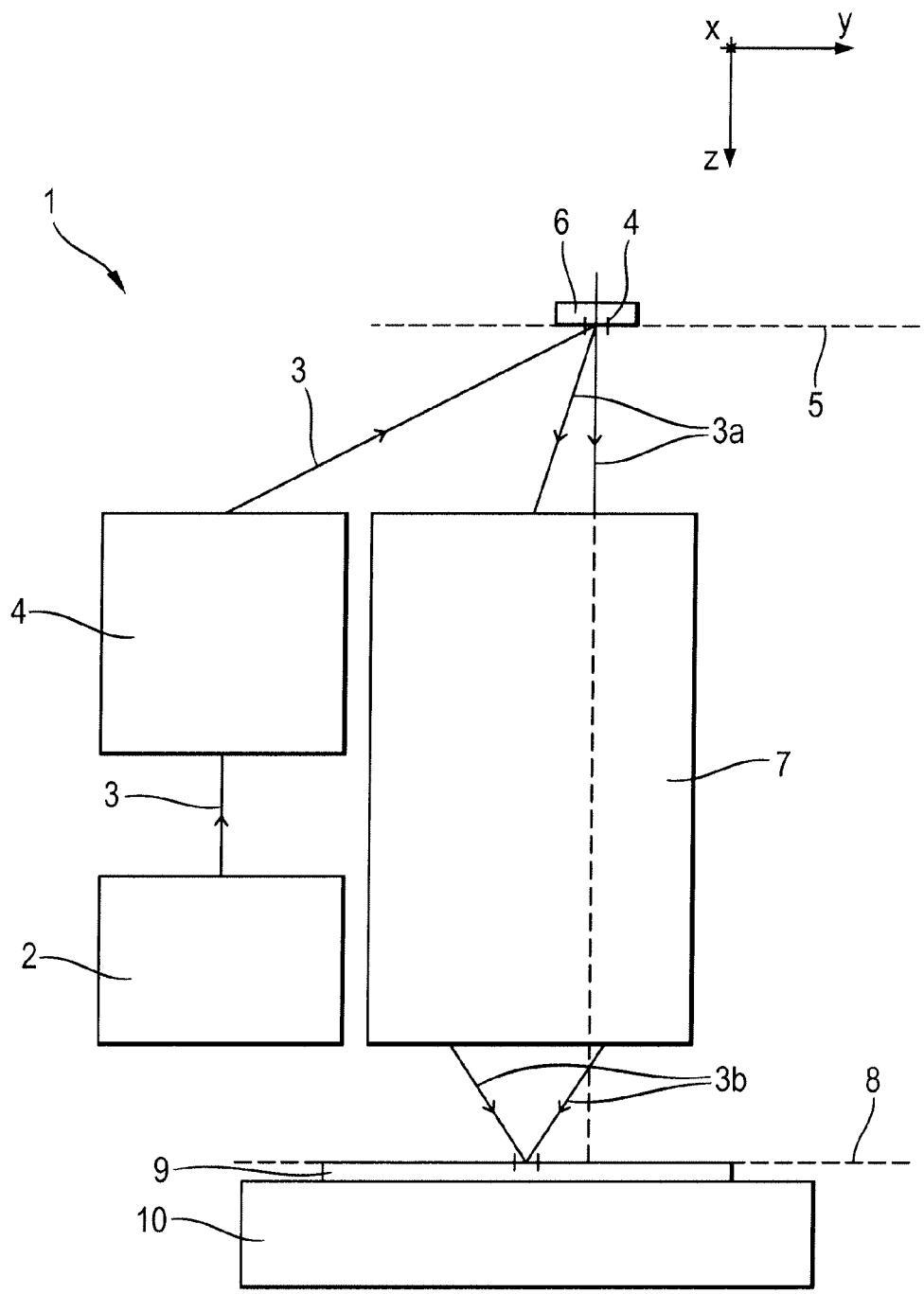
FIG. 1 is a schematic view of an embodiment of a projection exposure apparatus.

FIG. 1 is an exemplary and highly schematic view of a projection exposure apparatus 1 for lithography with UV, or EUV radiation. The projection exposure apparatus 1 has a light source 2. The light source emits illumination light 3 that is guided, by an illumination system 4 having optical elements (not shown), to an object field in an object plane 5. In object plane 5, a reticle 6 is arranged, having a structure to be imaged as an image field onto an object 9 arranged in image plane 8. In the example shown here, object 9 to be exposed is a wafer held in image plane 8 with the aid of an object holder 10. The object field in object plane 5 is imaged onto wafer 9 in image plane 8 with the aid of projection system 7. For this purpose, a light beam 3a originating from object plane 5 enters into projection system 7 and impinges on wafer 9 in the image plane in the desired imaging scale as a light beam 3b exiting from projection system 7. Projection exposure apparatus 1 is of the scanning type. Both reticle 6 and object 9 are scanned in the Y direction in the operation of projection exposure apparatus 1.

One or more of the mirrors of illumination system 4, and in particular projection system 7, can be a reflective optical element for a operating wavelength in the ultraviolet to extreme ultraviolet wavelength ranges, including, on a substrate, a reflective surface with a multilayer system having layers of at least two alternating materials with different real parts of the refractive index at the operating wavelength, wherein radiation in the operating wavelength of a certain incident angle bandwidth distribution can impinge on the reflective optical element, wherein the reflective surface has one or more first portions, in which the layers of alternating materials have a first period thickness, and one or more further portions, in which the layers of alternating materials have a first and at least one further period thickness, and wherein the arrangement of the first and further portions across the reflective surface is adapted to the incident angle bandwidth distribution.

Figure 2:
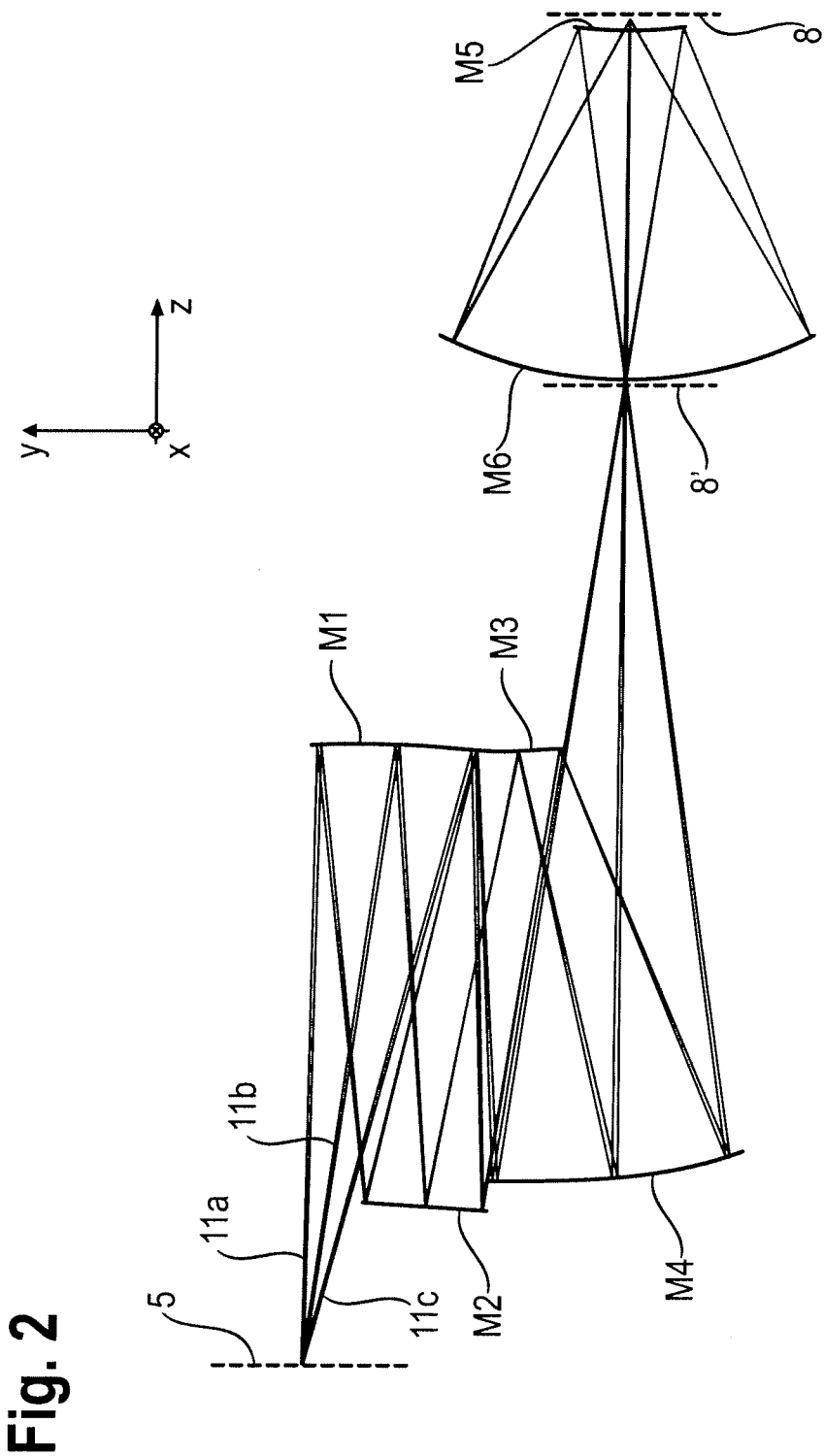
FIG. 2 is a schematic view of an embodiment of a projection system.

FIG. 2, in an exemplary and schematic manner, shows an embodiment of projection system 7 of FIG. 1, including six mirrors M1 to M6. Depending on the projection system used, more or fewer than six mirrors could be present. FIG. 2 shows the beam path of a central partial light beam 11b and two partial light beams 11a,c at the periphery of a combined light beam, originating from the object field in object plane 5, and imaged into the image field in image plane 8 via the six mirrors M1 to M6.

Mirrors M1 to M4 image object plane 5 into an intermediate image plane 8'. The partial light beams 11a-c intersect in one point of intermediate plane 8'. Therefore, the intermediate plane 8' is also called pupil plane 8'. The mirror M6 is arranged in the vicinity, in the present example behind the pupil plane 8' as seen in the radiating direction. The proximity or distance of an optical element such as mirror M6 to the nearest pupil plane can be parametrized by considering the distance D(CR) of the chief rays (not shown here) of the peripheral partial light beams 11a,c as well as the extension D(SA) of the surface in one direction irradiated on the respective optical element by a partial light beam 11a, b or c. One con define a parameter P as being the ratio of D(SA) to the sum of D(CR) and D(SA). If the respective reflective optical element is arranged exactly in the pupil plane, is D(CR) equal to 0 by definition. P would then be equal to 1. In case the respective optical element is arranged in a field plane, D(SA) would be equal to 0, since a partial light be ideally converges in the associated field point. P would then also be equal to 0. Accordingly, a reflective optical element is arranged near to a pupil plane, if D(CR)<<D(SA), in other words if P has a value near to 1. This concept of "nearness" to the pupil plane is explained more in detail in EP 1 930 771 A1 with respect to its FIG. 4. The content of EP 1 930 771 A1 is incorporated by reference. An obscuration shutter (not shown) is arranged in this pupil plane in a centered position. By this approach the partial beams associated with the central through openings in mirrors M5, M6 are obscured. Mirror M5, used together with mirror M6 for imaging the intermediate image in intermediate image plane 8' into image plane 8, is arranged in the vicinity of a further pupil plane, in which partial light beams 11a-c are combined again. The embodiment of the projection system shown in FIG. 2 is a system with central pupil obscuration.

Each of mirrors M1 to M6 can be one of the reflective optical elements described here. Reflectivity enhancement by adapting the arrangement of portions of the multilayer system having only one or more than one period thickness to the distribution of the incident angle bandwidths on each mirror, can be achieved, in the example shown in FIG. 2, for mirror M5, in particular, which in the example shown here is the mirror with the largest incident angle bandwidths.

Figure 3B:
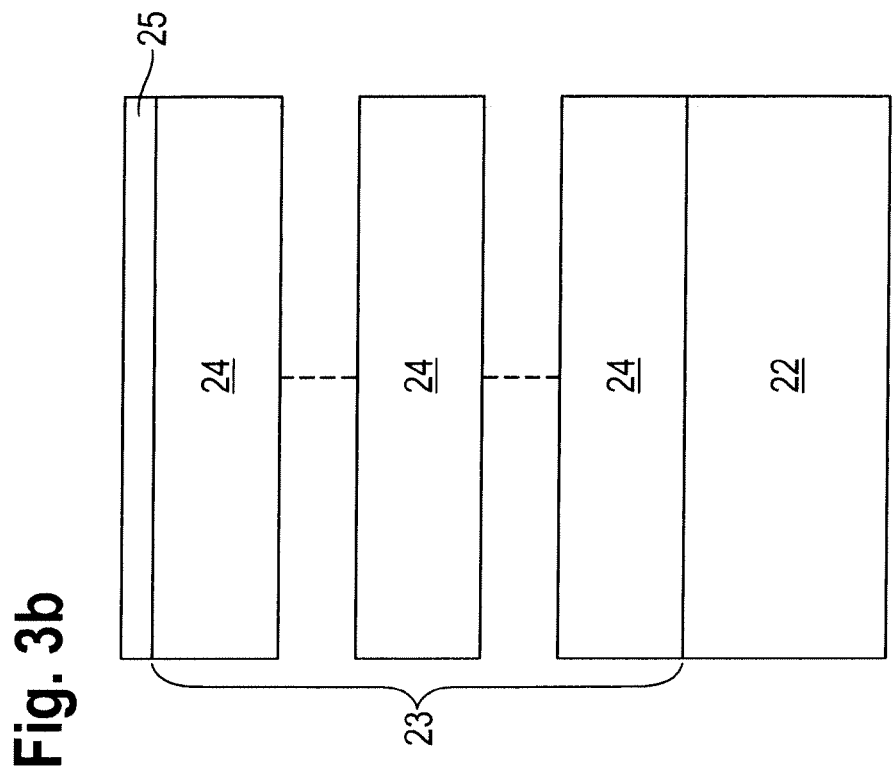
FIGS. 3a-c schematically show various variants of a multilayer system.
Figure 3A:
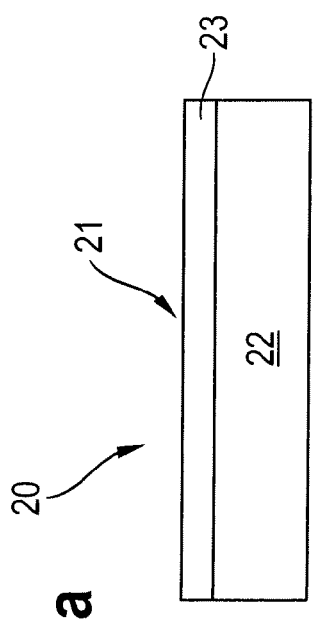
Figure 3C:
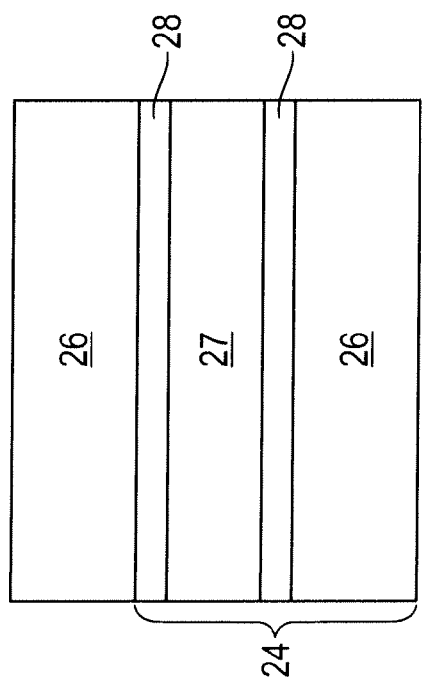

FIGS. 3a-c schematically show the structure of a reflective optical element 20. Applied to a substrate 22 is a multilayer system 23 that essentially forms reflective surface 21 (cf. FIG. 3a). FIG. 3b schematically shows the overall structure of multilayer system 23. Multilayer system 23 has been produced in the present example by successively coating a substrate 22 with various materials having different complex refractive indices. Moreover, a protective layer 25 for protection against external influences, such as contamination, which can be included of a plurality of different material layers, has been additionally applied to multilayer system 23. Multilayer system 23 essentially consists of a multitude of repetitive stacks 24 having a structure schematically shown in FIG. 3c for an embodiment, and having a thickness also referred to as a period thickness. The important layers of a stack 24 resulting in a sufficiently high reflection at a operating wavelength, in particular using of the multiple repetition of stacks 24, are the so-called spacer layers 26 of a material having a higher real part of the refractive index and the so-called absorber layers 27 of a material having a lower real part of the refractive index. This essentially simulates a crystal, wherein the absorber layers 27 correspond to the lattice planes within the crystal which have a distance from each other defined by the respective spacer layers 26, and on which the reflection of incident ultraviolet or in particular extreme ultraviolet radiation takes place. The thicknesses of the layers are chosen such that the radiation reflected on each absorber layer 27 constructively interferes at a certain operating wavelength, to thus achieve the high reflectivity of the reflective optical element. Herein, the reflectivity follows the Bragg condition and is thus dependent not only on the wavelength, but also on the incident angle.

In EUV lithography, wavelengths between 12 nm and 15 nm, for example, are favored. In this wavelength range, particularly high reflectivities can be achieved with multilayer systems on the basis of molybdenum as an absorber material and silicon as a spacer material. At a wavelength of 13.5 nm, theoretically, reflectivities in the range of above 75% are possible 50 to 60 stacks with a thickness of about 7 nm and a ratio of the absorber layer thickness to the stack thickness of about 0.4 can be used for example. In real molybdenum-silicon multilayer systems, however, a mixed layer of molybdenum silicide is formed, which leads to a substantial decrease in maximum reflectivity to be achieved. To counter the degradation of the optical properties, it is suggested according to the example shown in FIG. 3c, to provide an intermediate layer 28 both at the interfaces from spacer 26 to absorber 27 and at the interfaces from absorber 27 to spacer 26 to increase the thermodynamic and thermal stability of the multilayer system.

It should be noted that the thicknesses of the individual layers 26, 27, 28 as well as of the repetitive stacks 24, that is the period thicknesses across the entire multilayer system, can be constant, or could also vary, depending on which reflection profile is to be achieved. In particular, multilayer systems can be optimized for certain wavelengths where the maximum reflectivity and/or the reflected bandwidth is higher than with other wavelengths. For radiation of this wavelength, the respective reflective optical element 20 is used e.g. in EUV lithography, which is why this wavelength for which the reflective optical element 20 has been optimized, is also referred to as the operating wavelength. By selecting the alternating materials and layer thicknesses in a suitable manner, multilayer systems can also be designed for other wavelengths ranging into the x-ray or UV ranges.

Figure 4:
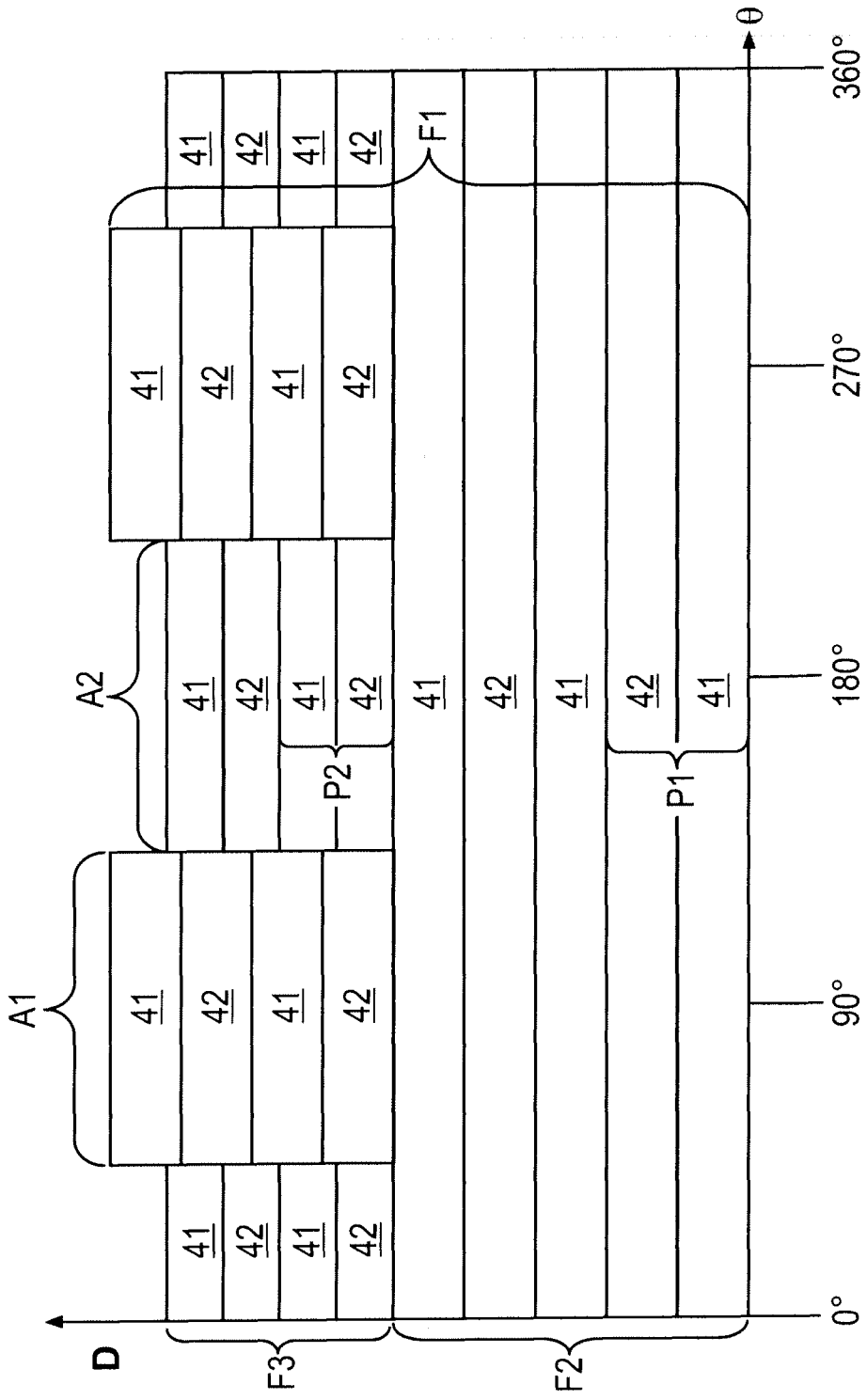
FIG. 4 schematically shows a first example of a distribution of different portions across the reflective surface of a reflective optical element.

The multilayer system for the reflective optical element described here, is subdivided into one or more first portions having a first period thickness and one or more further portions having the first and at least one further period thickness, wherein the arrangement of the first and further portions across the reflective surface is adapted to the incident angle bandwidth distribution on the reflective surface. Herein, the first portions are in areas of smaller incident angle bandwidths and further portions are in areas of larger incident angle bandwidths. Two embodiments of the thickness distribution within various portions of the multilayer system are shown in FIGS. 4 and 5 in an exemplary manner. Thickness D, the coordinate origin of which is on the substrate surface, is plotted as a function of the azimuthal angle θ for a fixed radial distance.

In the examples shown in FIGS. 4 and 5, the arrangement of the first and further portions A1, A2 is periodic with two periods in the azimuthal direction across the reflective surface. Herein, the first portions A1 have a sequence F1 of stacks each of one absorber layer 41 and one spacer layer 42, with exactly one period thickness P1, and the further portions A2 have two sequences F2, F3 of stacks also each having one absorber layer 41 and one spacer layer 42, wherein the sequence F2 of the further portions A2 having the same period thickness P2 as in the sequence F1 of the first portions A1 is arranged between the substrate and each sequence F3 arranged above it.

Both arrangements correspond to a distribution that can be expressed as $$D(r, \vartheta) = \sum_{i=1}^{N} D_i(r) \Psi_i(2\vartheta),$$

wherein r is the distance of a point of the reflective surface from a coordinate origin, θ is the azimuthal angle of the point on the reflective surface, N is the number of different sequences in a portion, $D_i(r)$ is a radially symmetrical layer thickness profile and $\Psi_i(2\vartheta)$ is an azimuthally periodic function. With this approach, the arrangement of the portions is particularly well adapted to a rectangular object or image field, as it is often used with projection exposure apparatuses, where the reticle is scanned continuously or in a step-wise manner.

In the example shown in FIG. 4, $\Psi_1(2\theta)$ is at a constant value of one for the layer thickness profile in sequence F1 of first portions A1, or first sequence F2 of the further portions A2, and $\Psi_2(2\theta)$ is a step function having a value of less than one for the layer profile in the second sequence F3 for an azimuthal angle of 0°-45°, 135°-225° and 315°-360°, and has a value of one for azimuthal angles of 45°-135° and 225°-315°. This results in a defined stack thickness P2 for the second sequence F3 of the second portions A2, that has a different value than the stack thickness P1 of the sequence F1 of the first portions A1, or the first sequence F2 of the further portions A2. To enable a simpler coating process in the present example, the first period thickness P1 is the same in all portions A1, A2, just like the second period thickness P2 additionally provided in further portions A2 is the same in all further portions A2.

In the example shown in FIG. 5, $\Psi_2(2\theta)$ is a cosine function. With this approach, the transition from first portions A1 in the areas 0° and 180° to further portions A2 in the areas 90° and 270° is continuous. In the further portions A2, the sequence F2 arranged between the substrate and the second sequence F3, and the sequence F1 of the first portions A1 has a constant first period thickness P1. In the second sequence F3 of the further portions A2, the period thickness P2 is modulated by the cosine function in the azimuthal direction.

It should be noted that, in the examples shown here, one type of first portions and one type of further portions is provided. Variations of the first period thicknesses and also the further period thicknesses are also conceivable. In particular, further portions with more than one further period thickness could also be provided.

Figure 6A:
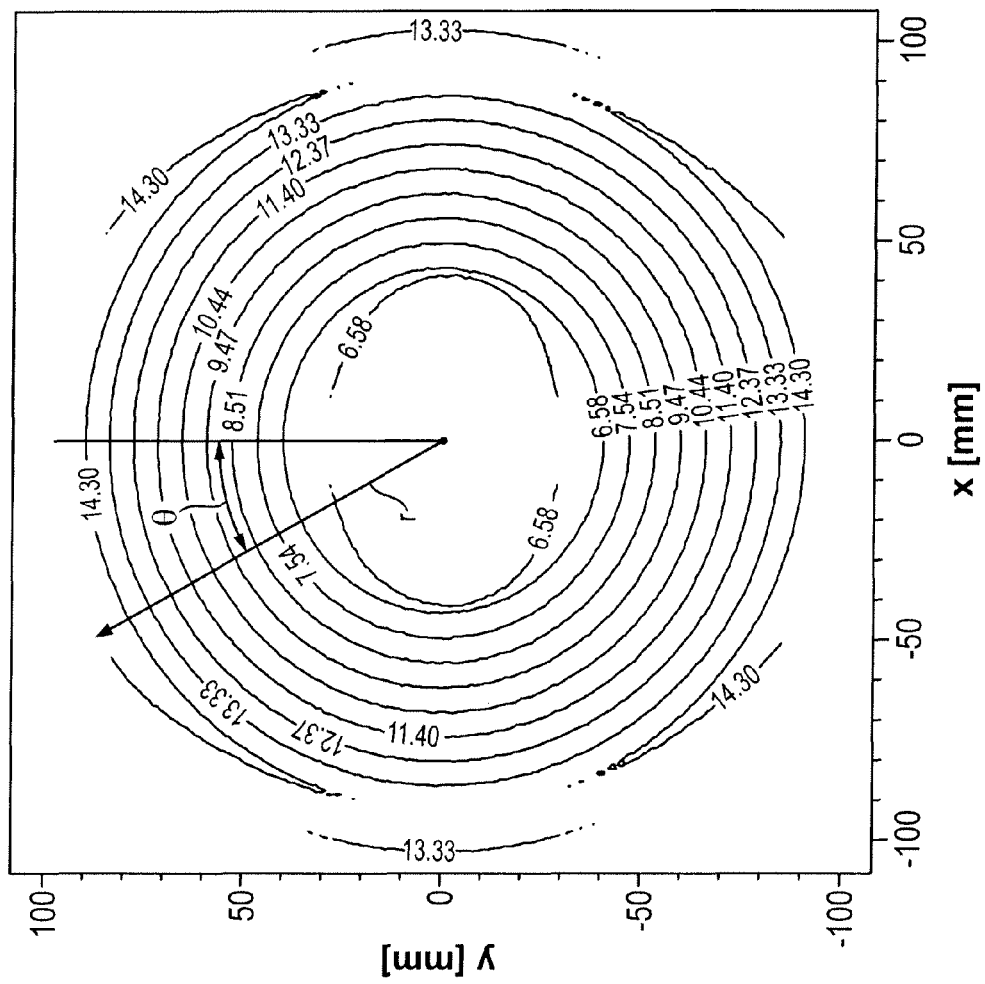
FIGS. 6a, b show an example of an incident angle distribution and the associated incident angle bandwidth distribution on mirror M5 of the projection system of FIG. 2.
Figure 6B:
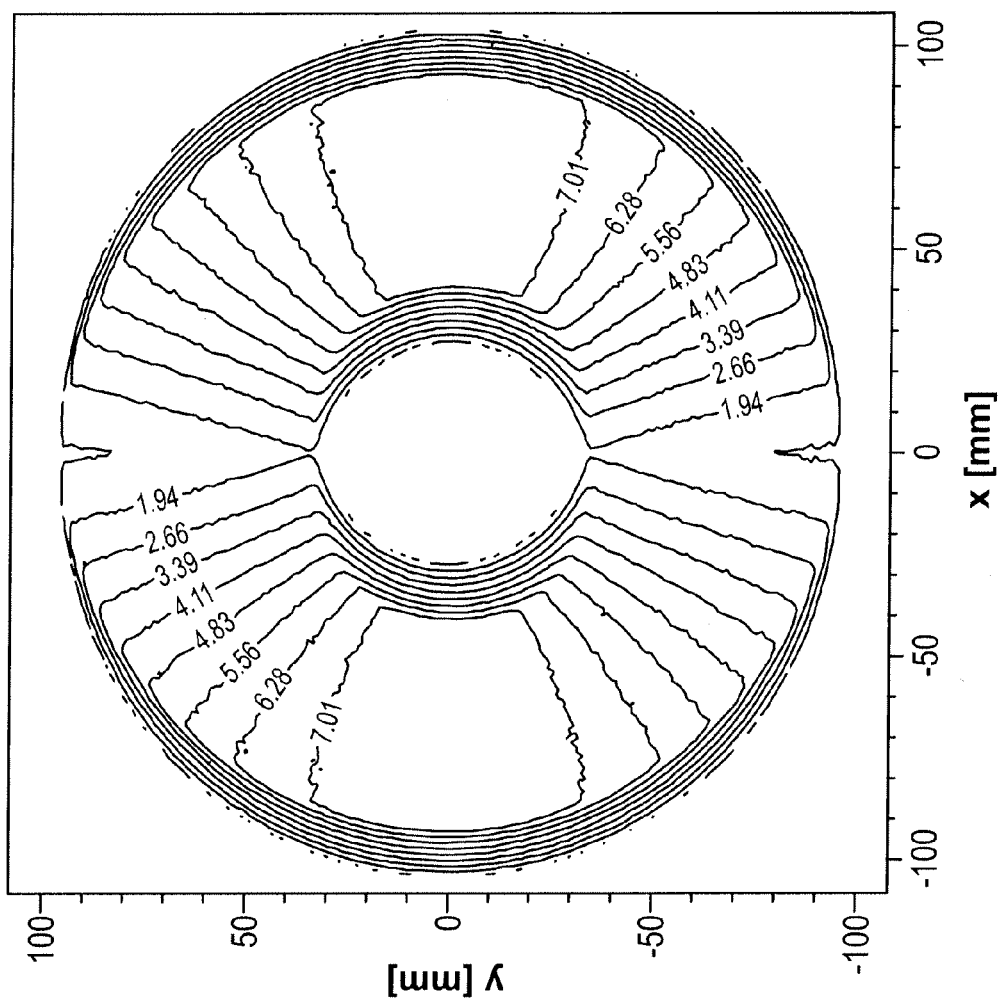

As a further exemplary embodiment, mirror M5 of projection system 7 shown in FIG. 2 of projection exposure apparatus 1 of FIG. 1 will be discussed in more detail in an embodiment for EUV lithography with a rectangular object or image field. In FIG. 6a, the distribution of the mean incident angle across the reflective surface of mirror M5 is shown as a contour line graph, wherein individual contour lines correspond to certain mean incident angles in degree. The reflective surface can be parameterized in polar coordinates r, θ. Mirror M5 has a passage in its center, through which the radiation reflected by following mirror M6 passes (cf. FIG. 2). The mean incident angle varies from about 6.58° at the periphery of the passage to about 14.30° at the outer periphery of the reflected surface. The deviation from the surface normal of the reflective surface is measured as the incident angle. In FIG. 6b, the incident angle bandwidth distribution across the reflective surface of mirror M5 is also shown as a contour line graph. Individual contour lines correspond to certain incident angle bandwidths. The incident angle bandwidths vary, in particular, in the azimuthal direction from about 1.94° at x=0 mm, that is 0° and 180°, to about 7.01° at y=0 mm, that is 90° and 270°, so that there is a two-wave distribution.

This wide variation of the incident angle bandwidths across the reflective surface of the pupil mirror M5 can lead to vastly different radiation intensities in the pupil of the projection system depending on whether it is a light beam of a field point in the center of the field or a field point at the field periphery. An example of an object or image field is schematically shown in FIG. 7c. The side length is substantially longer in the x direction than it is in the y direction. A plurality of beams is emitted from each field point (x, y) at various angles. A different intensity distribution results for each field point in the exit pupil. The intensity distributions for the field point in the center at (0, 0) and for the field point at the outer periphery of the field ($x_{max}$, 0) will be discussed in more detail in the following.

Figure 7A:
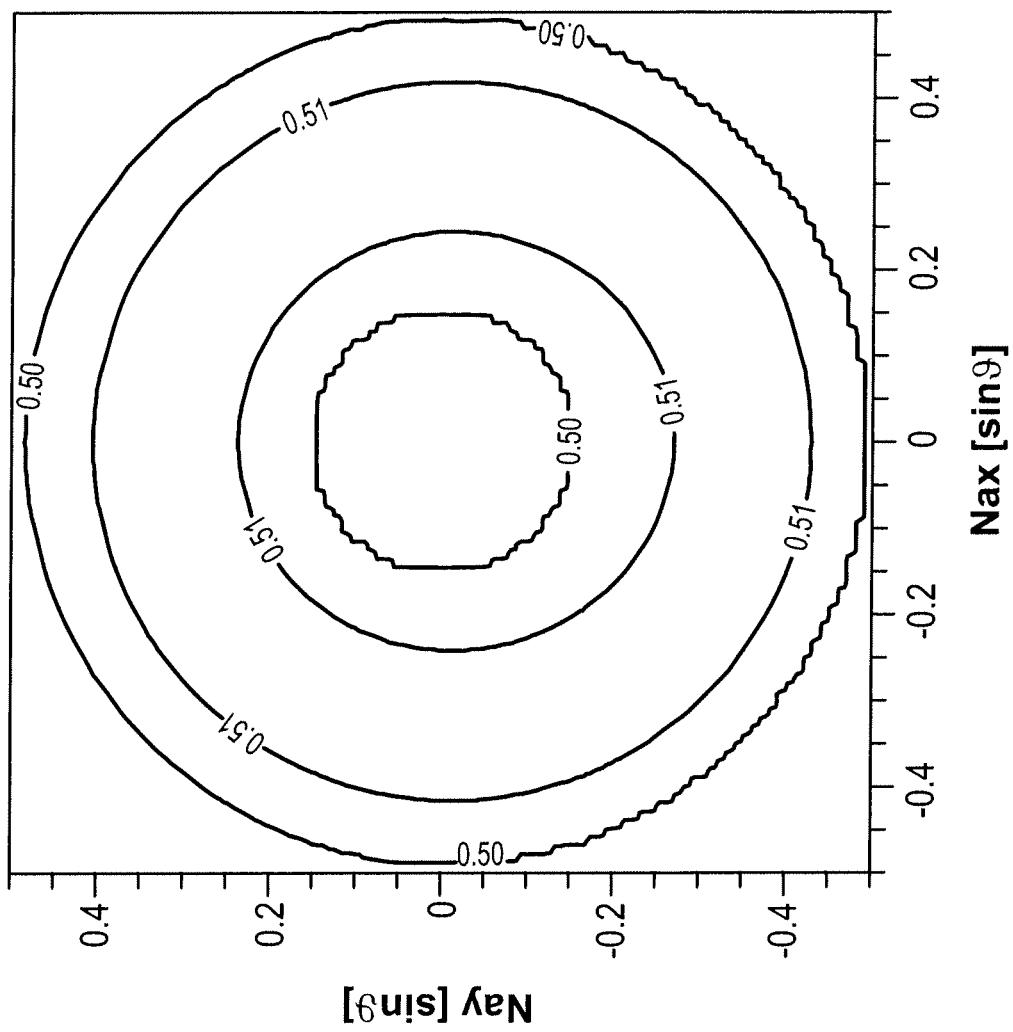
FIGS. 7a-d show the intensity distribution in the exit pupil of the projection system of FIG. 2, with a mirror M5 of the projection system having a rotation-symmetrical layer thickness distribution for a field point in the center of a rectangular field and for a field point at the outer periphery of a rectangular field, as well as the rectangular field and the geometry of the exit pupil.
Figure 7B:
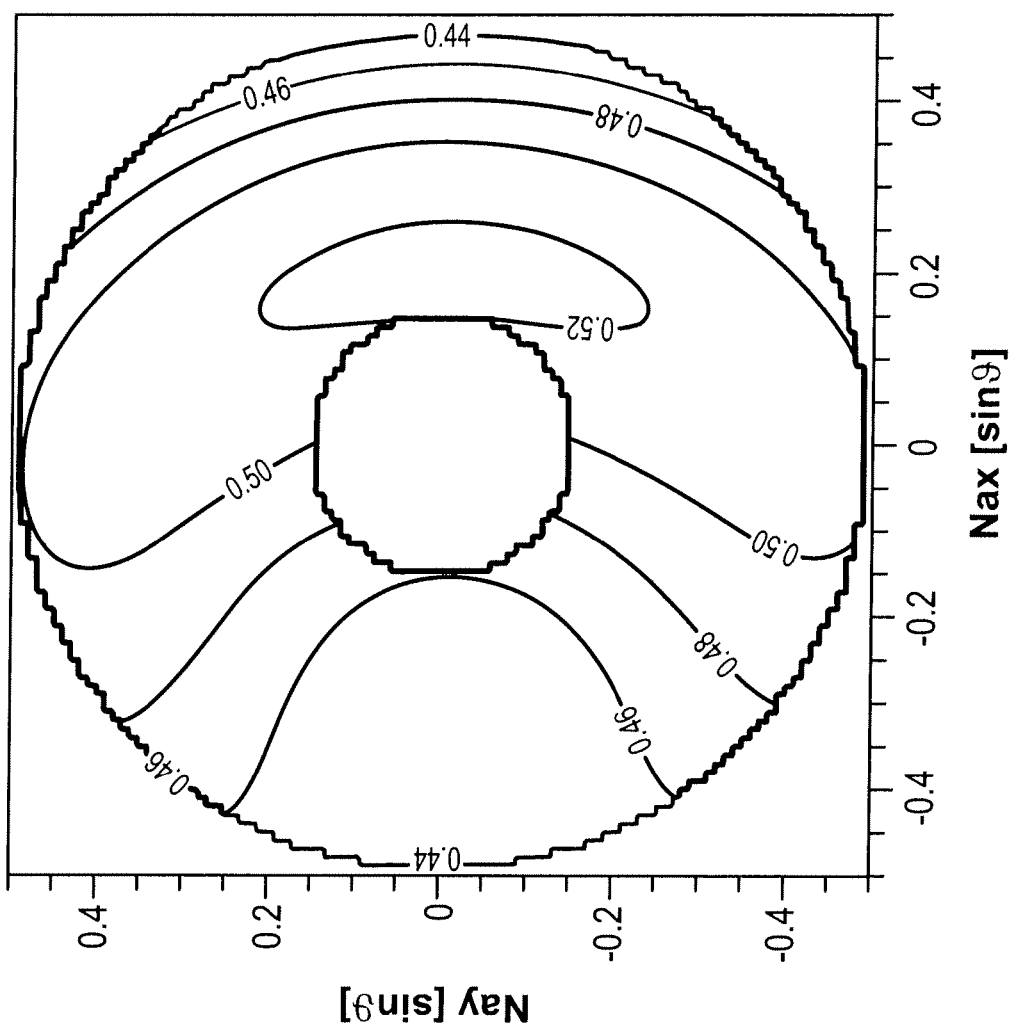

The intensity distribution in the pupil as transmission is shown for a pupil mirror, such as M5, of the projection system of FIG. 2, with a conventional multilayer system without portions having different period thicknesses, the arrangement of which is adapted to the incident angle bandwidth distribution, for a field point in the center of the field in FIG. 7a, and for a field point at the outer periphery of the field in FIG. 7b, as a contour line graph, wherein the contour lines correspond to certain transmission values. The extension of the pupil in the angle space having values of $\sin(\alpha)$, with α as the incident angle, is shown as the Fourier transform of the object or image field, as a function of which the mean transmission is plotted. The pupil has a hole in the middle because of the pupil obscuration. The higher the transmission, the higher is the throughput achievable with a projection exposure apparatus having such a mirror. The extension of the exit pupil corresponds to the numerical aperture NA of the respective projection system in plane normal to the beam direction and parametrized by Cartesian coordinates x and y, in the present example 0.5 as well in x direction (NAx) as in y direction (Nay).

The conventional multilayer system is a multilayer system on the basis of silicon as a spacer and ruthenium as an absorber, with intermediate layers of boron carbide for a operating wavelength of 13.5 nm. The sequence of layers in a stack is silicon—boron carbide—ruthenium—boron carbide. The layer thickness is 3.649 nm for the spacer layers, 3.153 nm for the absorber layers and 0.400 nm for the intermediate layers. The stack number is 16, the multilayer system is closed towards the vacuum by a 3.627 nm thick silicon layer, a 0.400 nm thick boron carbide layer, and a 1.5 nm thick ruthenium layer as a protective layer. These layer thicknesses are the nominal layer thicknesses d0. The multilayer system has a rotation-symmetrical layer thickness profile across the reflective surface with the following structure $$d(x,y)=d0*(C0+C2x*x^2+C2y*y^2)$$

with the coefficients $C0=9.10*10^{-01}$, $C2x=5.50*10^{-06}$, $C2y=5.50*10^{-06}$.

In the case shown in FIG. 7a of the beam emitted from the field center, the transmission varies between 0.4977 and 0.5133 across the pupil and has a mean value of 0.5090. The shift of the center of gravity of the transmission distribution with respect to the geometric center is measured by the parameter of telecentricity as $\arcsin(\alpha)$ in mrad. In the x direction, the telecentricity is at 0.0000 mrad, in the y direction, the telecentricity is at −0.2320 mrad. The closer the value is to 0, the smaller the shift and thus the risk of imaging defects.

Figure 7D:
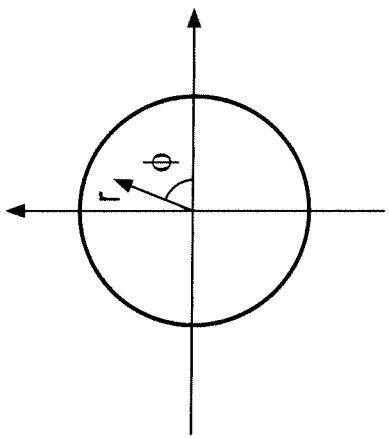
Figure 7C:
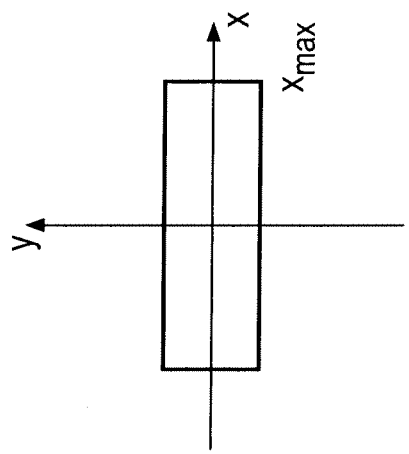

A further deviation from a homogeneously illuminated pupil is measured by the parameter of ellipticity in %. The ellipticity as a function of the field points (x,y) is defined as $$100\% \cdot \pi \cdot \frac{\int r\,dr\,d\varphi \cos(2\varphi) \cdot I(r, \varphi, x, y)}{\int r\,dr\,d\varphi \cdot I(r, \varphi, x, y)},$$

wherein the intensity 1 is integrated in each case across the entire exit pupil, and r and φ are the pupil coordinates (see also FIG. 7d showing schematically an exit pupil and polar coordinates). In FIG. 7a, the ellipticity is 0.0408%. The closer the ellipticity is to 0%, the less risk there is of imaging defects. In particular, the ellipticity is a measure for differences in the separation boarder between horizontal and vertical structures.

The distribution of the transmission for a field point at the outer periphery of the object or image field is shown in FIG. 7b for a mirror M5 having the above described conventional multilayer system. The transmission is much more irregularly distributed across the pupil than for a field point from the center of the field. The values vary between 0.5231 and 0.4288 with a mean value of 0.4871. In particular, the telecentricity in the x direction is quite high at 6.4867 mrad as is the ellipticity at −0.5509%, while the telecentricity is −0.0482 mrad in the y direction.

Figure 8A:
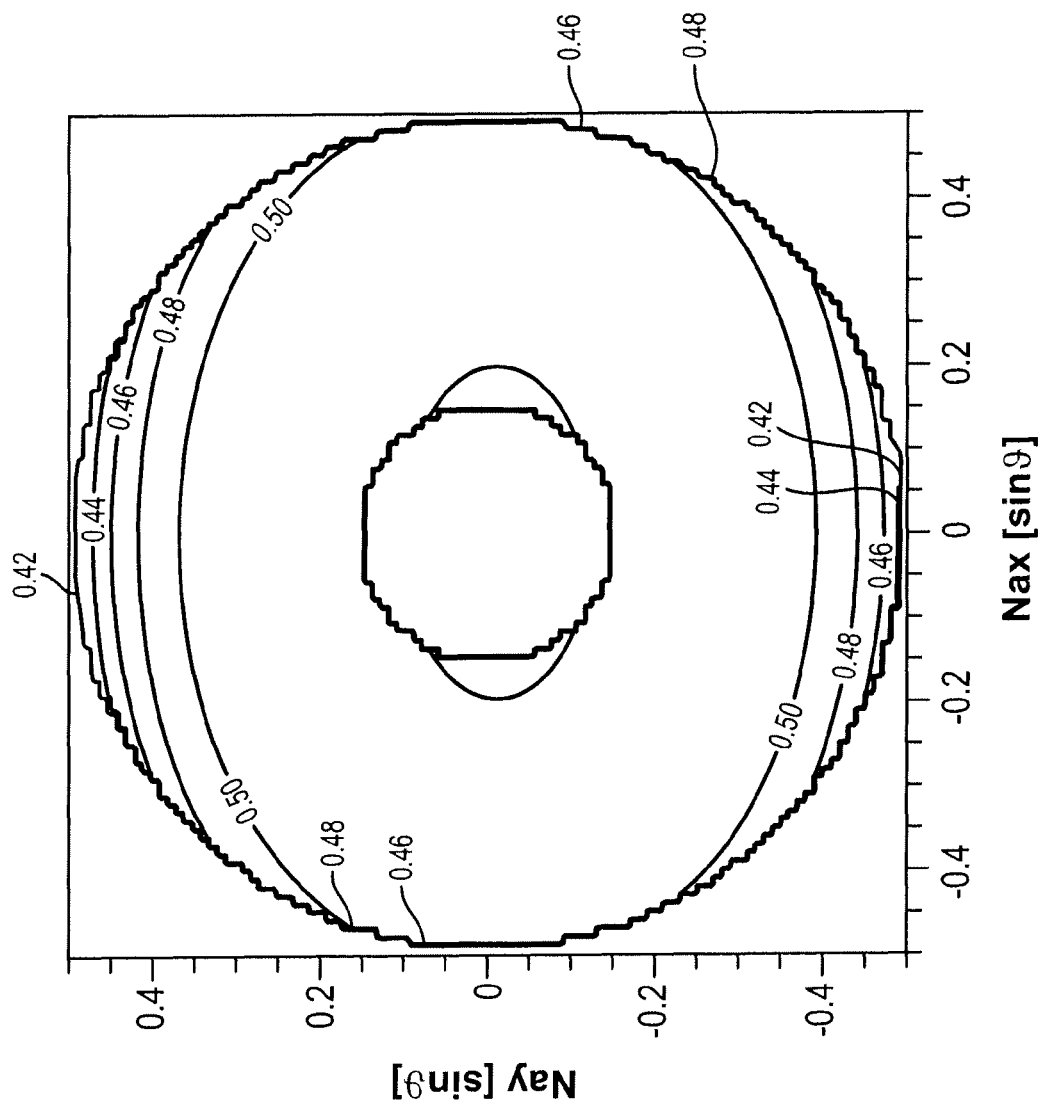
FIGS. 8a, b show the intensity distribution in the exit pupil of the projection system of FIG. 2, with a mirror M5 of the projection system having an azimuthally periodic layer thickness distribution for a field point in the center of a rectangular field and for a field point at the outer periphery of a rectangular field.

For comparison, the corresponding transmission distributions across the exit pupil for a mirror M5 are shown in FIG. 8a,b, which is configured as a reflective optical element described here. For this purpose, its multilayer system matches the conventional multilayer system as described with reference to FIGS. 7a,b with the exception of the layer thickness profile across the reflective surface, which is not rotation-symmetrical for the eighteen top layers, but two-wave azimuthally periodic. The layer thickness profile, for the first forty-nine layers has the coefficients $C0=9.33*10^{-01}$, $C2x=2.70*10^{-06}$, $C2y=2.70*10^{-06}$ and, for the eighteen layers on top of this, the coefficients $C0=9.40*10^{-01}$, $C2x=2.00*10^{-06}$, $C2y=-3.80*10^{-06}$. The layer thickness profile indicated above in Cartesian coordinates, has the following structure in polar coordinates $$d(r,\theta)=d0*[c0+0.5*r^2*((C2x+C2y)+(C2x-C2y)*\cos(2\theta))].$$

For the first forty-nine layers, the thicknesses are independent of $\theta$, since $C2x$ is equal to $C2y$. The result is a rotation-symmetrical distribution. For the eighteen top layers, a factor proportional to $\cos(2\theta)$ is added, since $C2x$ is unequal to $C2y$, so that for each value of r, that is each distance from the mirror center, a distribution of first portions and further portions results as shown in FIG. 5. The first portions are thus arranged in positions where the incident angle bandwidth tends to be smaller, and the further portions are arranged in positions where the incident angle bandwidth tends to be larger (cf. also FIG. 6b). Simultaneously, when choosing the actual values of the coefficients C0, C2x, C2y, it was taken into account, that for mean incident angles for respective azimuthal angles $\theta$ across the mirror surface the reflectivity should as high as possible.

Figure 8B:
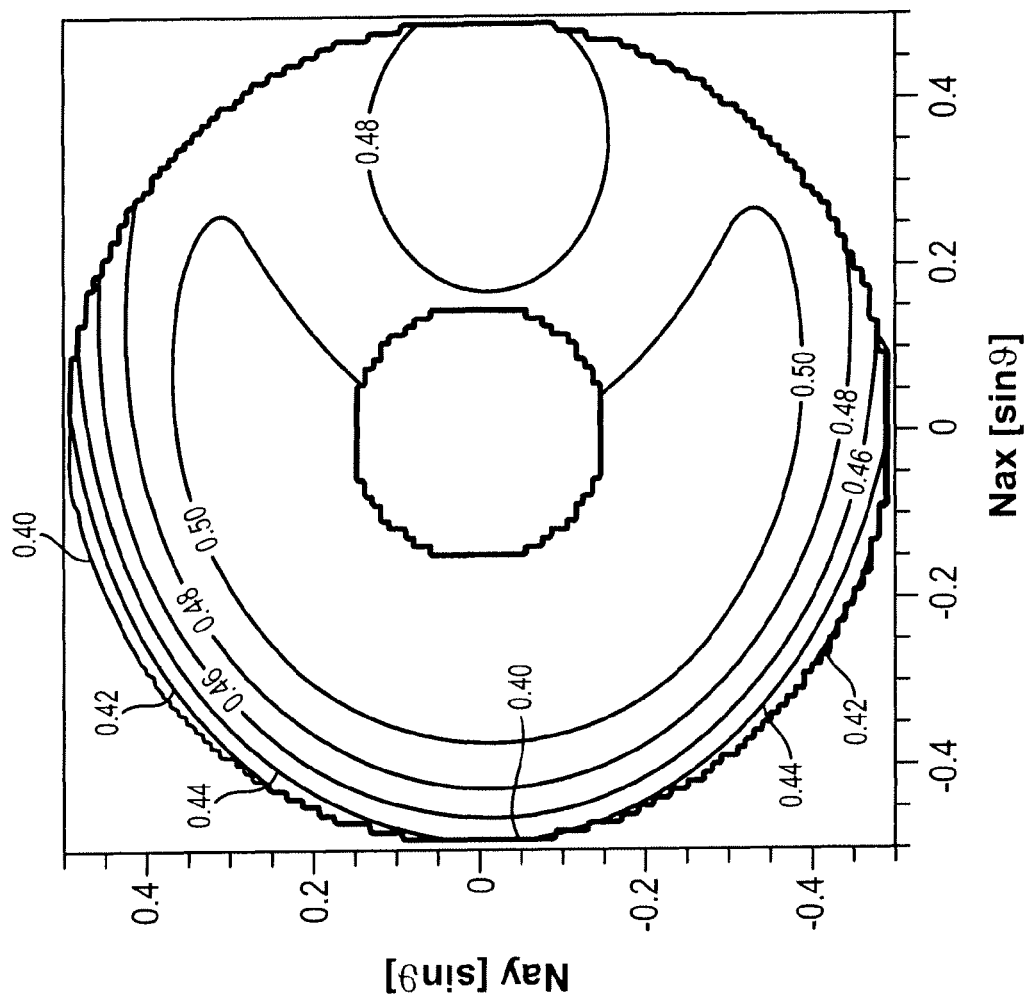

For the case of a field point from the center of the field as shown in FIG. 8a, the transmission varies between 0.4193 and 0.5105 across the pupil with a mean value of 0.5001. In the x direction, the telecentricity is at 0.0000 mrad, in the y direction the telecentricity is at −1.3339 mrad, while the ellipticity is 2.2986%. The distribution of the transmission is shown in FIG. 8b for the field point at the outer periphery of the object or image field. Transmission values vary between 0.5162 and 0.3875, with a mean value of 0.4884, at a telecentricity in the x direction of 0.7545 mrad and in the y direction of −1.4222 mrad and an ellipticity of −0.9086%. Thus, while the transmission distribution across the pupil is somewhat more irregular for the field point from the center of the field with a slightly lower mean transmission, the transmission distribution is substantially more uniform for the field point at the periphery of the field with a slightly higher mean transmission than with the conventional mirror M5. If all field points of the object or image field are considered, a much more uniform transmission distribution across the pupil results for the mirror M5 suggested here, with a slightly higher mean transmission. Thus, in the respective projection exposure apparatus, a higher throughput with simultaneously fewer imaging defects is enabled. In the example explained here, only one mirror of the projection system was modified in the manner described here. The more mirrors in the projection system, or the projection exposure apparatus, and also the reticle, as the case may be, that include a multilayer system adapted to the incident angle bandwidth distribution, the stronger is the positive effect.

It should be noted that the positive effect achieved with the type of multilayer system described here is independent of the choice of material, of the presence of intermediate layers, of the number of stacks and of the choice of operating wavelength. Rather, all hitherto known multilayer systems can be modified in the manner described here to obtain reflective optical elements for the UV or EUV lithography adapted to their respective incident angle bandwidth distributions and variations of mean incident angles.

LIST OF REFERENCE NUMERALS 1 projection exposure apparatus
2 light source
3 beam
3a light beam
3b light beam
4 illumination system
5 object plane
6 reticle
7 projection system
8 image plane
8' intermediate image plane
9 object
10 object holder
11a,c peripheral light beam
11b central light beam
12 reticle
20 reflective optical element
21 reflective surface
22 substrate
23 multilayer system
24 stack
25 protective layer
26 spacer
27 absorber
28 intermediate layer
41 absorber
42 spacer
M1 mirror
M2 mirror
M3 mirror
M4 mirror
M5 mirror
M6 mirror
A1 first portion
A2 further portion
P1 first period thickness
P2 further period thickness
F1 sequence
F2 sequence
F3 sequence

What is claimed is:

1. An optical element configured to be used at an operating wavelength, the optical element comprising:
   a substrate; and
   a reflective surface supported by the substrate, the reflective surface comprising a multilayer system comprising layers of at least first and second alternating materials having different real parts of the refractive index at the operating wavelength, wherein:
the reflective surface comprises a first portion which comprises a plurality of stacks;
each stack in the first portion comprises a layer of the first material and a nearest layer of the second material;
each stack in the first portion has the same thickness;
the reflective surface comprises a second portion which comprises a plurality of stacks;
the second portion comprises first and second regions;
each stack in the first region comprises a layer of the first material and a nearest layer of the second material;
each stack in the first region has the same thickness;
each stack in the second region comprises a layer of the first material and a nearest layer of the second material;
each stack in the second region has the same thickness;
the thickness of each stack in the first region is different from the thickness of each stack in the second region;
the thickness of each stack in the first region is different from the thickness of each stack in the first portion; and
an arrangement of the first and second portions across the reflective surface is adapted to an incident angle bandwidth distribution of radiation at the operating wavelength that can impinge on the reflective surface.

2. The optical element according to claim 1, wherein the operating wavelength is in the ultraviolet wavelength range to the extreme ultraviolet wavelength range.

3. The optical element according to claim 1, wherein the arrangement of the first and second portions across the reflective surface is adapted to a variation of a mean incidence angle of the radiation at the operating wavelength that can impinge on the reflective surface.

4. The optical element according to claim 1, wherein the reflective surface comprises two or more first portions, wherein the thickness of each stack is the same in all of the first portions.

5. The optical element according to claim 1, wherein the reflective surface comprises two or more second portions, wherein the thickness of each stack is the same in all the second portions.

6. The optical element according to claim 1, wherein the thickness of each stack in the first portion is the same as the thickness of each stack in the second region.

7. The optical element according to claim 6, wherein the second region is between the substrate and the first region.

8. The optical element according to claim 1, wherein the arrangement of the first and second portions is periodic in an azimuthal direction across the reflective surface.

9. The optical element according to claim 1, wherein the arrangement of the first and second portions is periodic in an azimuthal direction across the reflective surface with two periods.

10. The optical element according to claim 1, wherein the arrangement of the first and second portions corresponds to a distribution expressed as $$D(r, \theta) = \sum_{i=1}^{N} D_i(r)\Psi_i(2\theta),$$

where r is the distance of a point on the reflective surface from a coordinate origin, θ is an azimuthal angle of the point on the reflective surface, N is the number of different sequences in a portion, $D_i(r)$ is a radially symmetric layer thickness profile, and $\Psi_i(2\theta)$ is an azimuthally periodic function.

11. The optical element according to claim 10, wherein $\Psi_i(2\theta)$ is a step function.

12. The optical element according to claim 10, wherein $\Psi_i(2\theta)$ is a sine or cosine function.

13. A projection system, comprising:
an optical element configured to be used at an operating wavelength, the optical element comprising:
a substrate; and
a reflective surface supported by the substrate, the reflective surface comprising a multilayer system comprising layers of at least first and second alternating materials having different real parts of the refractive index at the operating wavelength, wherein:
the reflective surface comprises a first portion which comprises a plurality of stacks;
each stack in the first portion comprises a layer of the first material and a nearest layer of the second material;
each stack in the first portion has the same thickness;
the reflective surface comprises a second portion which comprises a plurality of stacks;
the second portion comprises first and second regions;
each stack in the first region comprises a layer of the first material and a nearest layer of the second material;
each stack in the first region has the same thickness;
each stack in the second region comprises a layer of the first material and a nearest layer of the second material;
each stack in the second region has the same thickness;
the thickness of each stack in the first region is different from the thickness of each stack in the second region;
the thickness of each stack in the first region is different from the thickness of each stack in the first portion; and
an arrangement of the first and second portions across the reflective surface is adapted to an incident angle bandwidth distribution of radiation at the operating wavelength that can impinge on the reflective surface; and
the projection system is a microlithography projection system.

14. The projection system according claim 13, wherein the operating wavelength is in the ultraviolet wavelength range to the extreme ultraviolet wavelength range.

15. The projection system according to claim 13, wherein the projection system is a pupil-obscured projection system.

16. The projection system according to claim 13, comprising a plurality of mirrors including a mirror having a largest incident angle bandwidth, wherein the optical element is the mirror having the largest incident angle bandwidth.

17. The projection system according to claim 13, comprising six mirrors in which the optical element is the fifth mirror along a path of the radiation through the projection system.

18. The projection system according to any claim 13, wherein the optical element is in a pupil plane of the projection system, or the optical element is in the vicinity of the pupil plane of the projection system.

19. A projection exposure apparatus, comprising:
a projection system, comprising an optical element configured to be used at an operating wavelength, the optical element comprising:
a substrate; and
a reflective surface supported by the substrate, the reflective surface comprising a multilayer system comprising layers of at least first and second alternating materials having different real parts of the refractive index at the operating wavelength, wherein:
the reflective surface comprises a first portion which comprises a plurality of stacks;
each stack in the first portion comprises a layer of the first material and a nearest layer of the second material;

each stack in the first portion has the same thickness;
the reflective surface comprises a second portion which comprises a plurality of stacks;
the second portion comprises first and second regions;
each stack in the first region comprises a layer of the first material and a nearest layer of the second material;
each stack in the first region has the same thickness;
each stack in the second region comprises a layer of the first material and a nearest layer of the second material;
each stack in the second region has the same thickness;
the thickness of each stack in the first region is different from the thickness of each stack in the second region;
the thickness of each stack in the first region is different from the thickness of each stack in the first portion; and
an arrangement of the first and second portions across the reflective surface is adapted to an incident angle bandwidth distribution of radiation at the operating wavelength that can impinge on the reflective surface; and
the projection exposure apparatus is a microlithography projection exposure apparatus.

20. The projection exposure apparatus according claim 19, wherein the operating wavelength is in the ultraviolet wavelength range to the extreme ultraviolet wavelength range.

21. The projection exposure apparatus according claim 19, further comprising an illumination system.

22. The projection exposure apparatus according claim 19, comprising a plurality of mirrors including a mirror having a largest incident angle bandwidth, wherein the optical element is the mirror having the largest incident angle bandwidth.

23. The projection exposure apparatus according claim 19, comprising six mirrors in which the optical element is the fifth mirror along a path of the radiation through the projection system.

* * * * *

UNITED STATES PATENT AND TRADEMARK OFFICE
CERTIFICATE OF CORRECTION

PATENT NO. : 8,610,876 B2  Page 1 of 1
APPLICATION NO. : 13/046137
DATED : December 17, 2013
INVENTOR(S) : Hans-Juergen Mann It is certified that error appears in the above-identified patent and that said Letters Patent is hereby corrected as shown below:

Title Page, Item (57), line 3, delete "a operating" and insert --an operating--;

In the Specification:

Column 1, line 18, delete "a operating" and insert --an operating--;

Column 2, line 21, delete "a operating" and insert --an operating--;

Column 6, line 28, delete "a operating" and insert --an operating--;

Column 6, lines 63-64, delete "One con" and insert --One can--;

Column 7, line 2, delete "be";

Column 7, line 42-43, delete "a operating" and insert --an operating--;

Column 7, lines 64-65, after "possible" insert --.--;

Column 10, lines 27-28, delete "a operating" and insert --an operating--;

Column 10, line 63, delete "intensity 1" and insert --intensity I--;

Column 11, line 2, delete "boarder" and insert --border--;

Column 11, lines 15-16, delete "FIG. 8a, b" and insert --FIGS. 8a,b--;

In the Claims:

Col. 14, line 38, in Claim 14, delete "according" and insert --according to--;

Col. 14, line 50, in Claim 18, delete "to any" and insert --to--;

Col. 16, line 3, in Claim 20, delete "according" and insert --according to--;

Col. 16, line 6, in Claim 21, delete "according" and insert --according to--;

Col. 16, line 8, in Claim 22, delete "according" and insert --according to--;

Col. 16, line 13, in Claim 23, delete "according" and insert --according to--.

Signed and Sealed this
Fifteenth Day of April, 2014

Michelle K. Lee
*Deputy Director of the United States Patent and Trademark Office*